US012787430B2

(12) United States Patent
Kim et al.

(10) Patent No.: US 12,787,430 B2
(45) Date of Patent: Nov. 3, 2026

(54) CELL ARCHITECTURE WITH IMPROVED BACKSIDE POWER RAIL THROUGH ENGINEERING CHANGE ORDER

(71) Applicant: SAMSUNG ELECTRONICS CO., LTD., Suwon-si (KR)

(72) Inventors: Jintae Kim, Clifton Park, NY (US); Kang-ill Seo, Springfield, VA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 418 days.

(21) Appl. No.: 18/382,301

(22) Filed: Oct. 20, 2023

(65) Prior Publication Data

US 2024/0413160 A1 Dec. 12, 2024

Related U.S. Application Data

(60) Provisional application No. 63/471,372, filed on Jun. 6, 2023.

(51) Int. Cl.
*H10D 84/90* (2025.01)
*H03K 19/20* (2006.01)

(52) U.S. Cl.
CPC .......... *H10D 84/907* (2025.01); *H03K 19/20* (2013.01); *H10D 84/981* (2025.01)

(58) Field of Classification Search
CPC ..... H10D 84/981; H10D 84/907; H10D 89/10
See application file for complete search history.

(56) References Cited

U.S. PATENT DOCUMENTS

| | | | | |
|---|---|---|---|---|
| 10,956,645 | B2 | 3/2021 | Chung et al. | |
| 11,443,777 | B2 | 9/2022 | Chen et al. | |
| 11,508,714 | B2 | 11/2022 | Liu | |
| 2021/0357565 | A1 | 11/2021 | Fang et al. | |
| 2022/0068813 | A1 | 3/2022 | Chen et al. | |
| 2022/0123751 | A1* | 4/2022 | Thyagarajan | G11C 11/417 |
| 2022/0230947 | A1 | 7/2022 | Park et al. | |
| 2022/0344255 | A1* | 10/2022 | Lai | G06F 30/39 |
| 2023/0090855 | A1 | 3/2023 | Wolpert et al. | |
| 2024/0222356 | A1* | 7/2024 | Mazza | H10D 89/10 |
| 2024/0413160 | A1* | 12/2024 | Kim | H10D 84/907 |

* cited by examiner

*Primary Examiner* — Edward Chin
(74) *Attorney, Agent, or Firm* — Myers Bigel, P.A.

(57) ABSTRACT

A semiconductor device includes: a plurality of cells including $1^{st}$ cells arranged in a $1^{st}$ row of a layout of the semiconductor device; and a $1^{st}$ backside power rail and a $2^{nd}$ backside power rail disposed below the $1^{st}$ cells, extended in a $1^{st}$ direction, and arranged in a $2^{nd}$ direction intersecting the $1^{st}$ direction, wherein the $1^{st}$ backside power has a $1^{st}$ width, and the $2^{nd}$ backside power rail has a $2^{nd}$ width which is different from the $1^{st}$ width.

20 Claims, 9 Drawing Sheets

1000

CELL ARCHITECTURE WITH IMPROVED BACKSIDE POWER RAIL THROUGH ENGINEERING CHANGE ORDER

CROSS-REFERENCE TO RELATED APPLICATION

This application is based on and claims priority from U.S. Provisional Application No. 63/471,372 filed on Jun. 6, 2023 in the U.S. Patent and Trademark Office, the disclosure of which is incorporated herein in its entirety by reference.

BACKGROUND

1. Field

Apparatuses consistent with example embodiments of the disclosure relate to a cell architecture of a semiconductor device including backside power rails formed in response to an engineering change order (ECO).

2. Description of Related Art

The engineering change order (ECO) is a process used in designing and manufacturing a semiconductor device. The ECO may require changing an existing layout of a cell architecture of the semiconductor device after an initial design or chip masking operation of the cell architecture is finished. For example, when connection structures in one or more cells of a cell architecture should change to prevent performance degradation or improve performance of the semiconductor device, an ECO may issue to require one or more metal lines, vias, or contact structures to be added, removed or repositioned in the cell architecture. These metal line, vias and contact structures may connect one or more device elements such as transistors in the cells to another circuit element in or out of the cell architecture.

As the demands for high device integration density and performance for a semiconductor device increase, the ECO has been used more frequently than not, and has become a requisite process in designing a cell architecture and manufacturing a semiconductor device based on the cell architecture.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

Various example embodiments provide a semiconductor device cell architecture including a plurality of cells in which at least one cell is redesigned from a fabric cell and power rails are disposed below the cells to form a backside power distribution network (BSPDN) for the semiconductor device.

According to embodiments, there is provided a semiconductor device which may include: a plurality of cells comprising a $1^{st}$ cell; and a $1^{st}$ backside power rail and a $2^{nd}$ backside power rail disposed below the $1^{st}$ cell, extended in a $1^{st}$ direction and arranged in a $2^{nd}$ direction intersecting the $1^{st}$ direction, wherein the $1^{st}$ backside power has a $1^{st}$ width, and the $2^{nd}$ backside power rail has a $2^{nd}$ width which is different from the $1^{st}$ width.

According to embodiments, the $1^{st}$ backside power rail may be disposed below an upper cell boundary or a lower cell boundary of the $1^{st}$ cell, and the $2^{nd}$ backside power rail may be disposed below an inside region of the $1^{st}$ cell.

According to embodiments, there is provided a semiconductor device which may include: a plurality of cells including $1^{st}$ cells arranged in a $1^{st}$ row of a layout of the semiconductor device; and a $1^{st}$ backside power rail and a $2^{nd}$ backside power rail disposed below the $1^{st}$ cells, extended in a $1^{st}$ direction, and arranged in a $2^{nd}$ direction intersecting the $1^{st}$ direction, wherein the $1^{st}$ backside power has a $1^{st}$ width, and the $2^{nd}$ backside power rail has a $2^{nd}$ width which is different from the $1^{st}$ width.

According to embodiments, the $1^{st}$ cells may comprise: a logic cell comprising a logic circuit configured to perform a logic function; and a dummy cell which does not comprise any logic circuit configured to perform a logic function.

According to embodiments, there is provided a semiconductor device which may include: a plurality of cells in a cell architecture including: at least one $1^{st}$ cell comprising a logic circuit configured to perform a logic function, and at least one dummy cell which does not comprise any logic circuit configured to perform a logic function; and a plurality of backside power rails disposed below the plurality of cells, and extended in a $1^{st}$ direction in parallel with each other.

According to embodiments, the at least one dummy cell may still include a plurality of gate structures.

BRIEF DESCRIPTION OF DRAWINGS

Example embodiments of the disclosure will be more clearly understood from the following detailed description taken in conjunction with the accompanying drawings in which.

DETAILED DESCRIPTION OF EMBODIMENTS

Figure 1A:
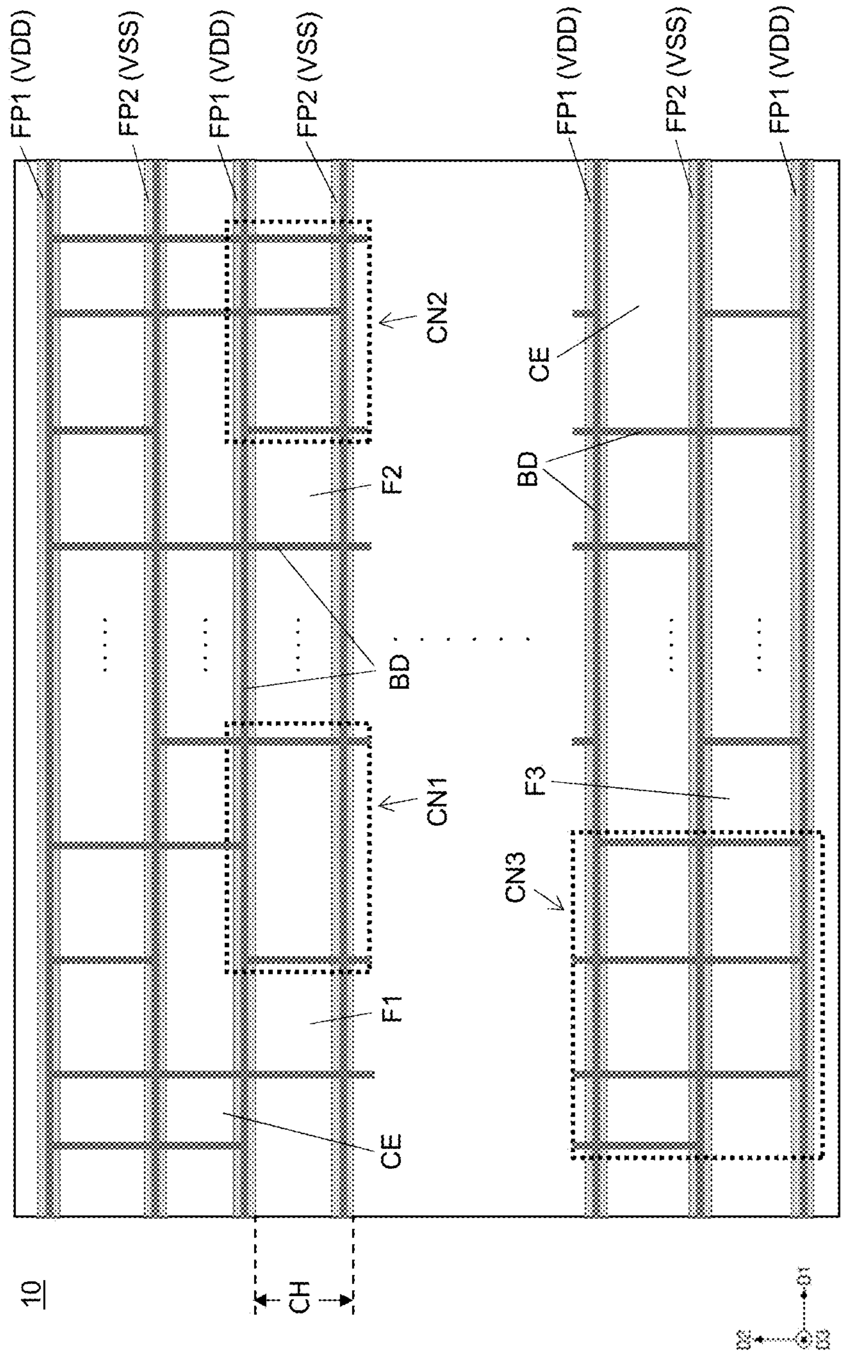
FIG. 1A illustrates a layout of a cell architecture in which a plurality of fabric cells are included, according to an embodiment.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" or "equal" is used to compare a dimension of two or more elements, the term may cover a "substantially same" or "substantially equal" dimension. Further, when a term "coplanar" or "aligned" is used to compare a positional relationship between two or more elements, the term may also cover "a substantially coplanar" or "substantially alighted" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity. Thus, it is to be understood that such schematic illustrations may not reflect actual images when any of the structures described herein are examined through scanning electron microscopy (SEM), transmission electron microscopy (TEM), focused ion beam (FIB) microscopy, etc.

For the sake of brevity, conventional elements, structures or layers of semiconductor devices including a nanosheet transistor, a fin field-effect transistor, and materials forming the same may or may not be described in detail herein. For example, a certain isolation layer or structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments.

When an ECO issues to change an existing layout of a cell architecture for a semiconductor device, a substantial redesign of the cell architecture may be required, which costs significant time and resources. In order to prevent such substantial redesign, the cell architecture may be initially designed to include a plurality of fabric cells at positions where a possible redesign may be performed after an initial design or chip masking operation of the cell architecture is completed.

Figure 1C:
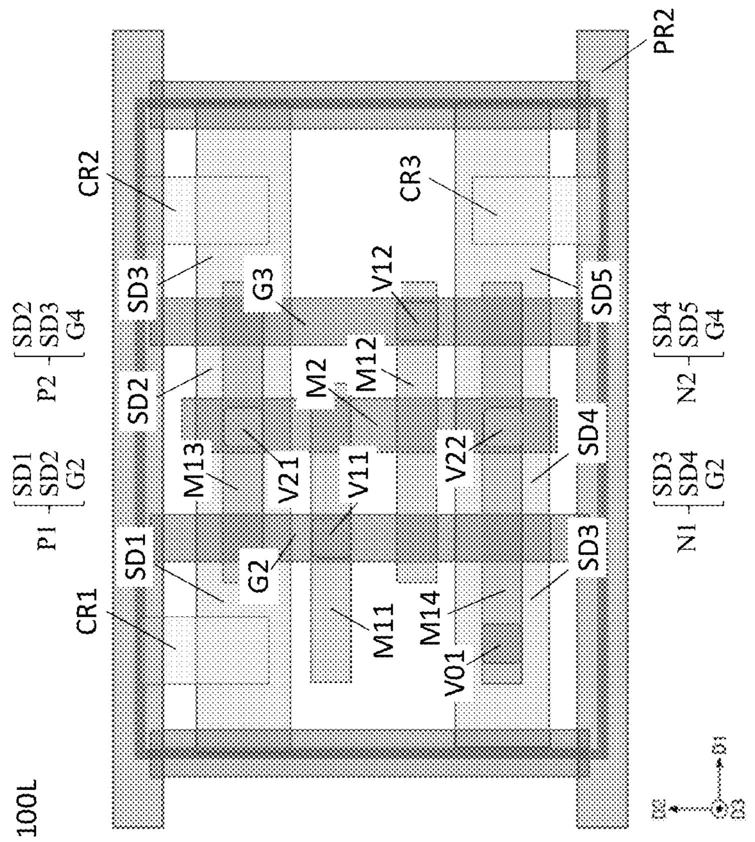
FIG. 1C illustrates a layout of a logic cell which is formed by changing the fabric cell of FIG. 1B to include a logic gate therein, according to an embodiment.
Figure 1B:
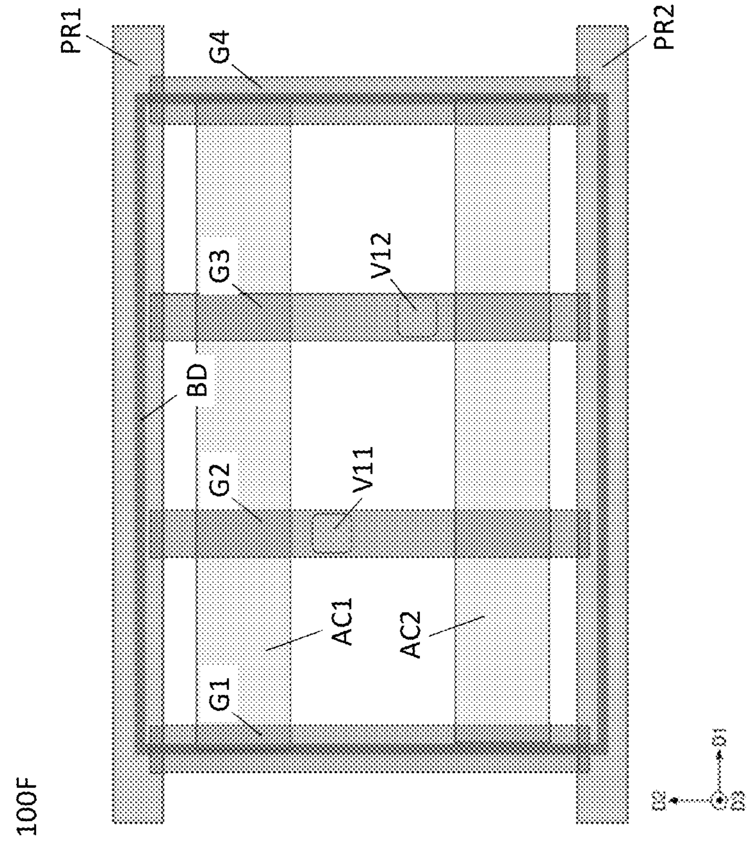
FIG. 1B illustrates a layout of a fabric cell formed in the cell architecture of FIG. 1A, according to an embodiment.
Figure 1D:
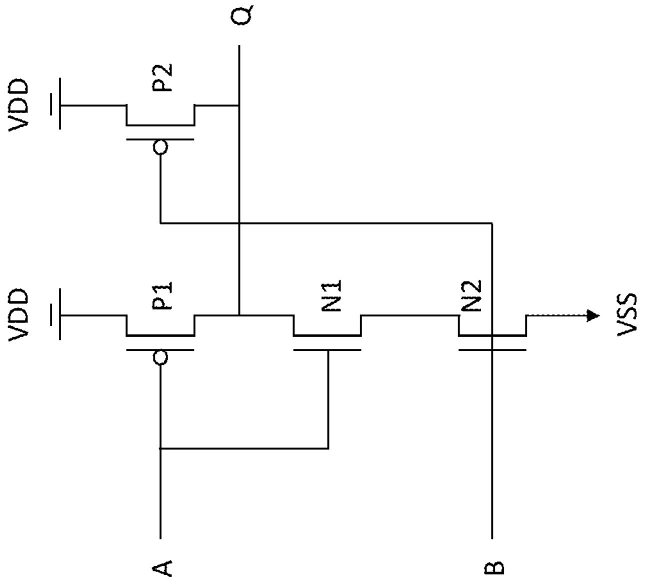
FIG. 1D illustrates a schematic of the logic gate included in the logic cell of FIG. 1C.

FIG. 1A illustrates a layout of a cell architecture in which a plurality of fabric cells are included, according to an embodiment. FIG. 1B illustrates a layout of a fabric cell formed in the cell architecture of FIG. 1A, according to an embodiment. FIG. 1C illustrates a layout of a logic cell which is formed by changing the fabric cell of FIG. 1B to include a logic gate therein, according to an embodiment. FIG. 1D illustrates a schematic of the logic gate included in the logic cell of FIG. 1C.

Referring to FIG. 1A, a cell architecture 10 corresponding to an integrated circuit such as a large-scale integration (LSI) circuit may include a plurality of cells CE and a plurality of 1$^{st}$ power rails FP1 and 2$^{nd}$ power rails FP2 disposed above the cells CE. Between the cells CE may be formed cell boundaries BD, which may be implemented by a diffusion break structure, a shallow trench isolation (STI) structure, a fin-cut structure, or so on, if necessary.

Each of the cells CE may be formed of one or more standard cells implementing a logic gate such as inverter, NAND, NOR, XOR, AOI, etc., not being limited thereto, based on one or more transistors. Thus, the cells CE may be variously sized subject to respective logic functions implemented by one or more logic gates formed therein although they may have the same cell height CH. The power rails FP1 and FP2 may be extended in a D1 direction along and directly above upper boundaries and lower boundaries among the cell boundaries BD, and may be alternatingly arranged in a D2 direction. As the power rails FP1 and FP2 are disposed above the upper boundaries and the lower boundaries of the cells formed on a substrate of a semiconductor device, these power rails FP1 and FP2 may be referred to as frontside power rails or form a frontside power distribution network. The 1$^{st}$ power rails FP1 may each be connected to a positive voltage source, and the 2$^{nd}$ power rails FP2 may each be connected to ground (a negative voltage source). The D1 and D2 directions are horizontally intersecting each other, and vertically intersect a D3 direction.

The cell architecture 10 may also include a plurality of fabric cells F1-F3 which may each be a dummy cell in which no logic function is implemented or no logic gate is formed. These fabric cells may be formed at selected positions in the cell architecture 10 where a possible circuit redesign may be expected. For example, the fabric cells F1-F3 may be formed at positions adjacent to candidate regions CN1-CN3, respectively, in which complicated circuits (e.g., arithmetic logic unit (ALU)) are formed, and thus, a circuit redesign is more probable than other regions in the cell architecture 10. Although the cell architecture 10 is shown to include only three fabric cells, more or less than three fabric cell may be preliminarily formed in the cell architecture 20. Also, although one fabric cell is formed at a position adjacent to a candidate region for a circuit redesign, more than one fabric cells may be formed at positions adjacent to the candidate region.

Thus, when a circuit analysis/test performed after cell placement and routing for the cell architecture 10 indeed requires a circuit redesign in one of the candidate regions CN1-CN3, and such redesign may be addressed by implementing an additional logic function, an ECO may issue to redesign a circuit in the candidate region in the cell architecture 10. In response, a fabric cell among the fabric cells F1-F3 at a position adjacent to the candidate region may be changed to include the additional logic gate therein. When the additional logic gate is formed in the corresponding fabric cell, the cell architecture 10 may avoid a redesign of the existing circuit in the candidate region by, for example, securing an additional area for the additional logic gat, and adding or rerouting metal lines or vias, etc. which costs significant time and resources. Thus, the ECO for the cell architecture 10 may be responded by simply forming an additional logic gate in at least one of the fabric cells F1-F3.

FIG. 1B shows a fabric cell 100F which may be or correspond to one of the fabric cells F1-F3 formed at a position adjacent to or near a corresponding one of the candidate regions CN1-CN3 as shown in FIG. 1A.

The fabric cell 100F may include 1$^{st}$ to 4$^{th}$ gate structures G1-G4 formed across 1$^{st}$ and 2$^{nd}$ active regions AC1 and AC2 in the D2 direction, and two vias V11 and V12 formed on the 2$^{nd}$ and 3$^{rd}$ gate structures G2 and G3, respectively. These gate structures and active regions may be cell structures initially formed or placed in the cell architecture 20 and common structures of the cells CE. However, in the fabric cell 100F, no source/drain regions may be formed on the active regions AC1 and AC2, and no interconnects such as metal lines, vias, or contact structures may be formed on the gate structures G1-G4 or the source/drain regions. Thus, the fabric cell 100F may be only a dummy cell in which no logic gate is formed and no logic function is implemented.

However, the power rails FP1 and FP2 respectively connected to a positive voltage source and ground may still be disposed above and along the upper boundaries and the lower boundaries of the cells CE. Thus, when the fabric cell 100F is changed to a logic cell, one or more of the gate structures G1-G4 may be configured to receive gate input signals for respective transistors, and source/drain regions may be formed on the active regions AC1 and AC2 to constitute one or more transistors. Further, a plurality of metal lines and additional vias may be formed to connect one or more of the source/drain regions to the power rails FP1 and FP2 so that the logic cell can be powered.

Although the fabric cell 100F shown in FIG. 1B includes the vias V11 and V12 formed on the gate structures G2 and G3, respectively, the fabric cell 100F may be formed to not include these vias, which may be formed when the fabric cell 100F is redesigned as a logic cell.

FIG. 1C shows a logic cell 100L which is formed by changing the fabric cell 100F to implement therein the logic gate shown in FIG. 1D. The logic gate may be a NAND gate, for example.

In response to an ECO to redesign one of the candidate regions CN1-CN3 shown in FIG. 1A, the fabric cell 100F reserved to be adjacent to the candidate region may be changed to the logic cell 100L that may include a 1$^{st}$ p-type metal-oxide semiconductor field-effect transistor (PMOS) P1, a 2$^{nd}$ PMOS P2, a 1$^{st}$ n-type metal-oxide semiconductor field-effect transistor (NMOS) N1, and a 2$^{nd}$ NMOS N2 to form the NAND gate.

The 1$^{st}$ PMOS P1 may be formed by implementing 1$^{st}$ and 2$^{nd}$ source/drain regions SD1 and SD2 on the 1$^{st}$ active region AC1 and connecting these two source/drain regions to each other through a channel structures (now shown) surrounded by the 2$^{nd}$ gate structure G2. The 2$^{nd}$ PMOS P2 may be formed by implementing the 2$^{nd}$ and 3$^{rd}$ source/drain regions SD2 and SD3 on the 1$^{st}$ active region AC1 and connecting these two source/drain regions to each other through a channel structures (now shown) surrounded by the 3$^{rd}$ gate structure G3. The 1$^{st}$ NMOS N1 may be formed by implementing 4$^{th}$ and 5$^{th}$ source/drain regions SD4 and SD5 on the 2$^{nd}$ active region AC2 and connecting these two source/drain regions to each other through a channel structures (now shown) surrounded by the 2$^{nd}$ gate structure G2. The 2$^{nd}$ NMOS N2 may be formed by implementing the 5$^{th}$ and 6$^{th}$ source/drain regions SD5 and SD6 on the 2$^{nd}$ active region AC2 and connecting these two source/drain regions to each other through a channel structures (now shown) surrounded by the 3$^{rd}$ gate structure G3.

Further, the 1$^{st}$ source/drain region of the PMOS1 and the 3$^{rd}$ source/drain region of the PMOS2 may be connected to the 1$^{st}$ power rail FP1 through contact structures CR1 and CR2, respectively, to receive a positive voltage VDD, and 6$^{th}$ source/drain region of the NMOS2 may be connected to the 2$^{nd}$ power rail FP2 to be grounded through a contact structure CR3. These contact structures CR1, CR2 and CR3 may be formed on top surfaces of the 1$^{st}$, 3$^{rd}$ and 6$^{th}$ source/drain regions, respectively, when a semiconductor device based on the cell architecture 10 is manufactured.

A metal line M11 may receive and deliver a common gate input signal A for the 1$^{st}$ PMOS P1 and the 1$^{st}$ NMOS N1 to the 2$^{nd}$ gate structure G2 through the via V11. A metal line M12 may receive and deliver a common gate input signal B for the 1$^{st}$ NMOS N1 and the 2$^{nd}$ PMOS P2 to the 3$^{rd}$ gate structure G3 through the via V12.

A metal line M13 may be connected to the 2$^{nd}$ source/drain region of the 1$^{st}$ and 2$^{nd}$ PMOSs P1 and P2, and a metal line M14 may be connected to the 4$^{th}$ source/drain region of the 1$^{st}$ NMOS N1, to receive and output a common output signal Q to the meal line M2 through the vias V21, V01 and V22, respectively.

In the above manner, the fabric cell 100F may be changed to the logic cell 100L when an ECO requiring a redesign of one of the candidate regions CN1-CN3 in the cell architecture 10, thereby responding to the ECO without a substantially redesign of the candidate region in the cell architecture 10.

However, there remains a limitation to taking advantages of the fabric cell 100F when the logic gate formed therein turns out to cause an excessive current-resistance (IR) drop or dynamic voltage droop (DVD) which may degrade performance of the cell architecture 10. In response, a redesign of the existing power grid or adding power straps to the existing power grid may be considered. However, because of a strict design rule regarding size and placement of power rails in a cell architecture, the power rails FP1 and FP2 may not be simply redesigned, and instead, may require a substantial redesign of the cell architecture 10.

Figure 2A:
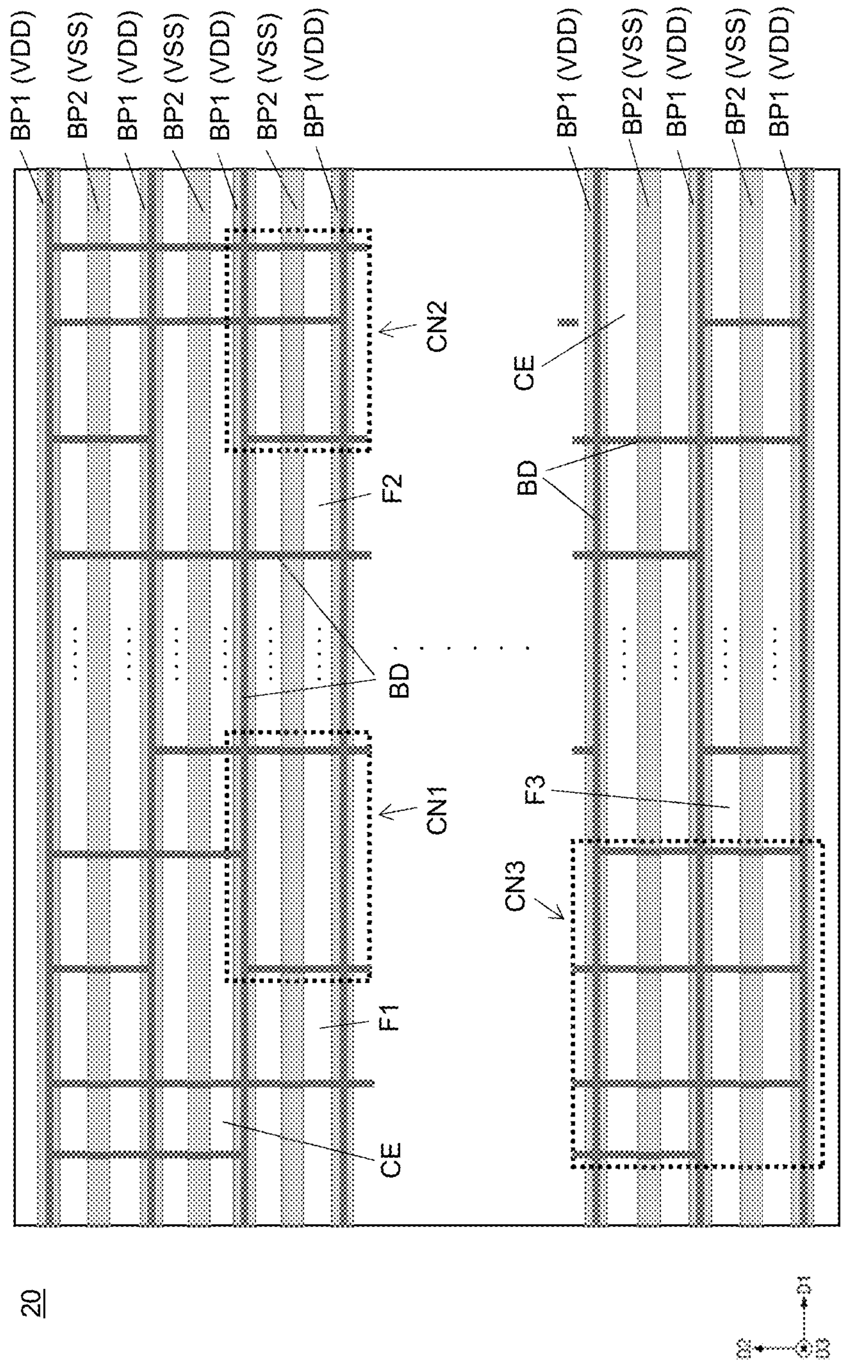
FIG. 2A illustrates a layout of a cell architecture including a backside power rail distribution network (BSPDN) and a plurality of fabric cells, according to an embodiment.
Figure 2C:
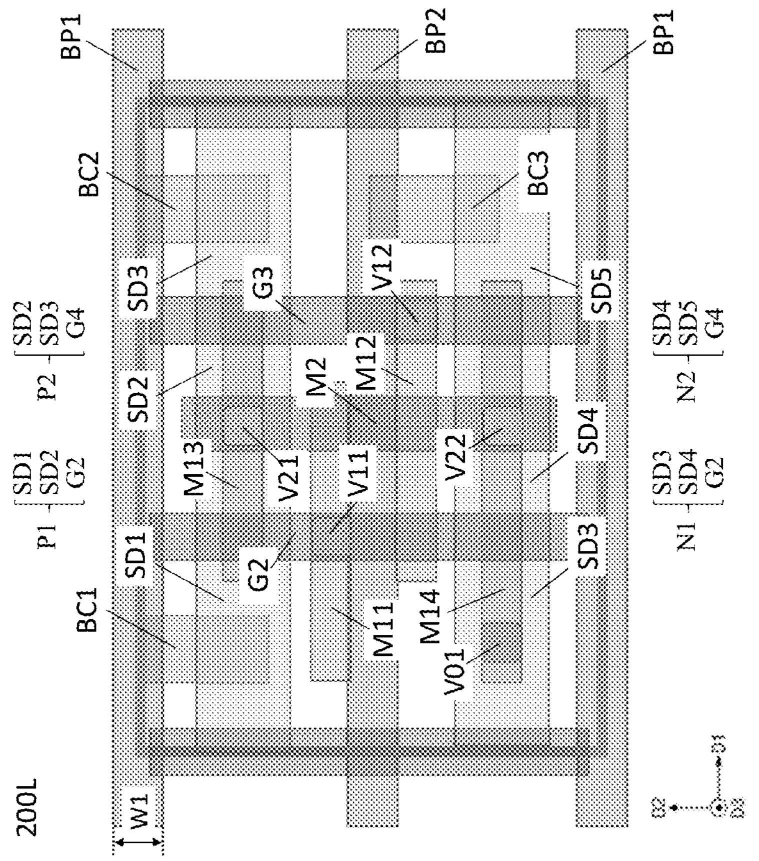
FIG. 2C illustrates a layout of a logic cell which is formed by changing the fabric cell of FIG. 2B, according to an embodiment.
Figure 2B:
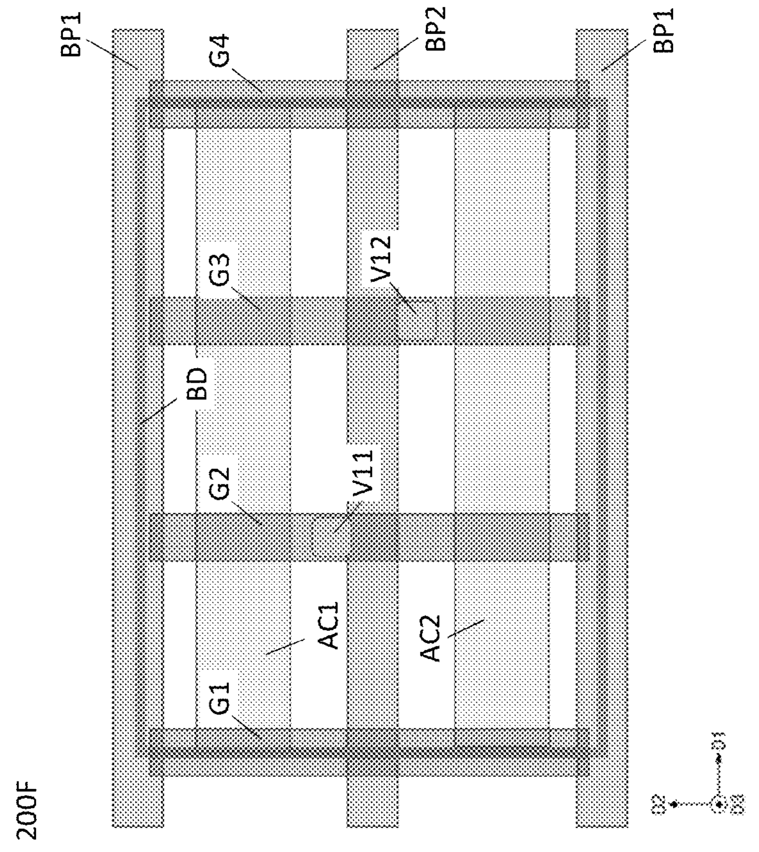
FIG. 2B illustrates a layout of a fabric cell formed in the cell architecture of FIG. 2A, according to an embodiment.

FIG. 2A illustrates a layout of a cell architecture including a backside power rail distribution network (BSPDN) and a plurality of fabric cells, according to an embodiment. FIG. 2B illustrates a layout of a fabric cell formed in the cell architecture of FIG. 2A, according to an embodiment. FIG. 2C illustrates a layout of a logic cell which is formed by changing the fabric cell of FIG. 2B, according to an embodiment.

Referring to FIG. 2A, a cell architecture 20 may include the same cells CE including the fabric cells F1-F3 with the same cell boundaries BD included in the cell architecture 10 of FIG. 1A. Thus, duplicate descriptions thereof including the fabric cells F1-F3 may be omitted herein.

However, the cell architecture 20 differ from the cell architecture 10 in that a plurality of 1$^{st}$ backside power rails BP1 and 2$^{nd}$ backside power rails BP2 may be disposed below the cells CE. For example, the 1$^{st}$ backside power rails BP1 may be extended in the D1 direction along and directly below the upper boundaries and the lower boundaries of the cells CE, and the 2$^{nd}$ backside power rails BP2 may be extended in the D1 direction across and directly below the inside region of the cells CE. Thus, the number of power rails in the cell architecture 20 may be greater than that of the power rails in the cell architecture 10. When a semiconductor device is manufactured based on the cell architecture 20, the backside power rails BP1 and BP2 may be formed in a backside isolation structure which replaces a substrate of the semiconductor device at a back side of the semiconductor device, while the power rails FP1 and FP2 of the cell architecture 10 are formed at a front side of the semiconductor device.

FIG. 2A shows that the 1$^{st}$ backside power rail BP1 and the 2$^{nd}$ backside power rail BP2 are alternatingly arranged below the cell architecture 20. However, the disclosure may not be limited thereto, and, according to embodiments, there may be more than one 2$^{nd}$ backside power rail BP2 formed between two vertically adjacent 1$^{st}$ backside power rails BP1, and two or more 1$^{st}$ backside power rail BP1 may be arranged successively in the D2 direction without the 2$^{nd}$ backside power rail BP2 therebetween. Further, according to embodiments, the 1$^{st}$ backside power rail BP1 instead of the 2$^{nd}$ backside power rail BP2 may be formed directly below the inside region of the each cell CE, according to another embodiment.

The above-described arrangement of backside power rails may be enabled at least because formation of power rails at the back side of a semiconductor device may not be bound by the cell design rule, such as minimum spacing requirements, applied to a front side of the semiconductor device.

Still, the backside power rails BP1 and BP2 may be extended in the D1 direction in parallel with each other. The 1$^{st}$ backside power rails BP1 may each be connected to a positive voltage source, and the 2$^{nd}$ backside power rails BP2 may each be connected to ground (a negative voltage source).

When the 2$^{nd}$ backside power rail BP2 is disposed directly below the inside region of each cell CE, a connection distance between a power rail and circuit elements (e.g., a source/drain region) of each cell CE in the cell architecture 20 may be reduced compared to that in the cell architecture 10. Thus, an IR drop or a DvD that may be caused by a long connection distance between the circuit elements and the power rail, or additional metal lines or vias for power rail connection may be addressed by the arrangement of the backside power rails BP1 and BP2 as shown in FIG. 2A. Further, the number of metal lines or vias used for connection with power rails directly above or below the cells CE may be reduced. Moreover, the 2$^{nd}$ backside power rail BP2 may provide an additional connection flexibility to the circuit elements in each cell CE by avoiding a heavy interconnect traffic at a front side of the cell architecture 20.

As shown in FIG. 2A, the cell architecture 20 may also include the fabric cells F1-F3 near the candidate regions CN1-CN3 for a circuit redesign. Thus, when at least one of the fabric cells F1-F3 is changed to a logic cell in response to an ECO, the logic cell may address not only a necessary circuit redesign but also power rail requirements due to the backside power rails BP1 and BP2 formed in the cell architecture 20.

FIG. 2B shows a fabric cell 200F which may be or correspond to one of the fabric cells F1-F3 formed at a position adjacent to or near a corresponding one of the candidate regions CN1-CN3 as shown in FIG. 2A.

Since the fabric cell 200F may also be a dummy cell as the fabric cell 100F of FIG. 1B, no source/drain regions and interconnects may be formed therein while the 1$^{st}$ to 4$^{th}$ gate structures G1-G4 with the two vias V11 and V12 thereon may be formed across 1$^{st}$ and 2$^{nd}$ active regions AC1 and AC2 in the D2 direction. Like in the fabric cell 100F, the vias V11 and V12 may not be formed therein according to another embodiment. However, unlike the fabric cell 100F, the 1$^{st}$ backside power rails BP1 may be disposed directly below an upper boundary as well as a lower boundary of the fabric cell 200F, and the $2^{nd}$ backside power rail BP2 may be formed directly below an inside region of the fabric cell 200F.

FIG. 2C shows a logic cell 200L which is formed by changing the fabric cell 200F to implement therein the logic gate shown in FIG. 1D, which is a NAND gate.

In response to an ECO to redesign one of the candidate regions CN1-CN3 shown in FIG. 2A, the fabric cell 200F reserved to be adjacent to the candidate region may be changed to the logic cell 200L that includes the same $1^{st}$ PMOS P1, $2^{nd}$ PMOS P2, $1^{st}$ NMOS N1, and $2^{nd}$ NMOS N2 of the logic cell 100L. Further, the interconnects including the metal lines M11-M14, M2 and the vias V01, V11, V12, V21 and V21 may be the same as those in the cell architecture 10. Thus, duplicate descriptions thereof may be omitted herein.

However, as the backside power rails BP1 and BP2 are formed at the back side of the cell architecture 20, these backside power rails BP1 and BP2 may be connected to the $1^{st}$, $3^{rd}$ and $6^{th}$ source/drain regions through backside contact structures BC1, BC2 and BC3 formed on bottom surfaces of the $1^{st}$, $3^{rd}$ and $6^{th}$ source/drain regions, respectively. Like the backside power rails BP1 and BP2, the backside contact structures BC1, BC2 and BC3 may also be formed in the same backside isolation structure when a semiconductor device is manufactured based on the cell architecture 20. The backside power rails BP1, BP2 and the backside contact structures BC1, BC2 and BC3 along with the backside isolation structure forms a BSPDN of the cell architecture 20.

Further, due to the $2^{nd}$ backside power rail BP2 formed below an inside region of the fabric cell 200F, the backside contact structure BC3 may be connected to this $2^{nd}$ backside power rail BR2.

In the above manner, the cell architecture 20 including the backside power rails BP1 and BP2 may also include the fabric cell 200F, and this fabric cell 200F may be changed to the logic cell 200L when an ECO requiring a redesign of one of the candidate regions CN1-CN3 in the cell architecture 20, thereby responding to the ECO without a substantially redesign of the candidate region in the cell architecture 20. Moreover, the $2^{nd}$ backside power rail BP2 formed below the inside region of the logic cell 200L may provide at least connection flexibility to the circuit elements in the logic cell 200L by avoiding a heavy interconnect traffic at a front side of the logic cell 100L.

The formation of backside power rails and fabric cells may not be limited to the above embodiments. When a power rail is required to have a greater size to more effectively address an IP drop or a DVD in a logic cell formed by changing a fabric cell, a width of one or more of backside power rails formed below the logic cell may be increased in the cell architecture, according to embodiments.

Figure 3A:
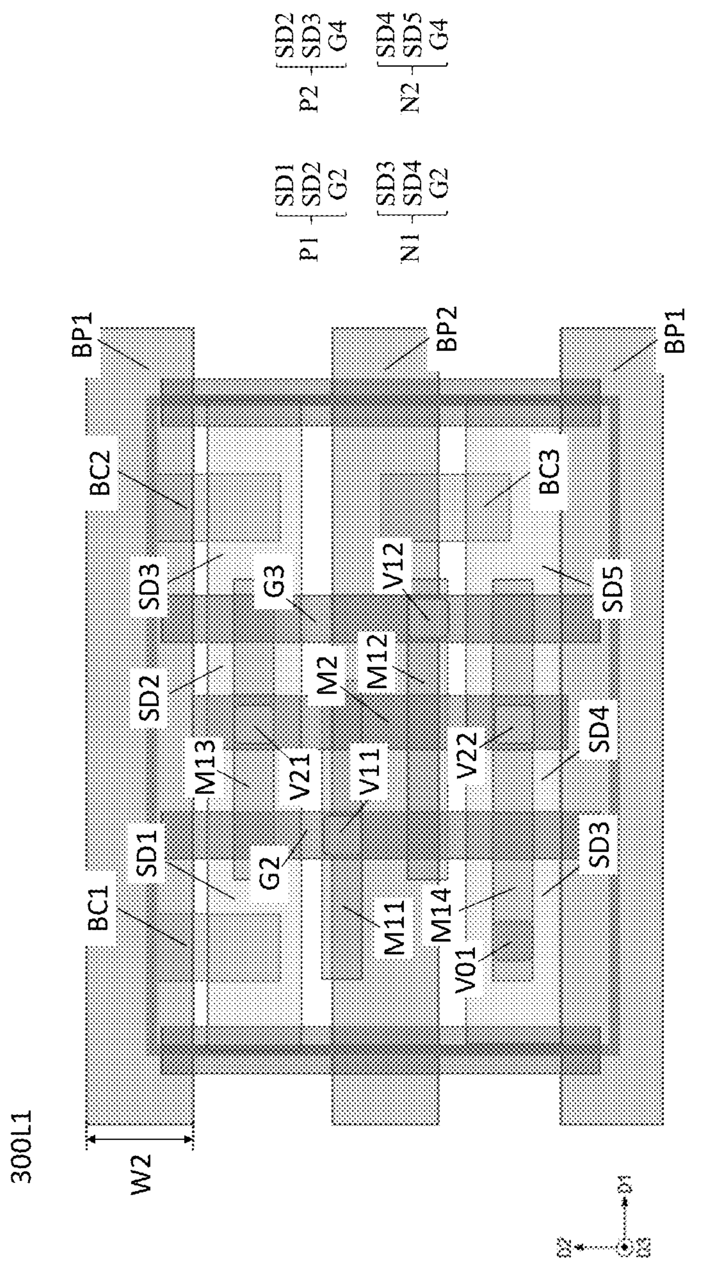
FIG. 3A illustrates a layout of a logic cell changed from a fabric cell in a cell architecture including a BSPDN, according to another embodiment.
Figure 3B:
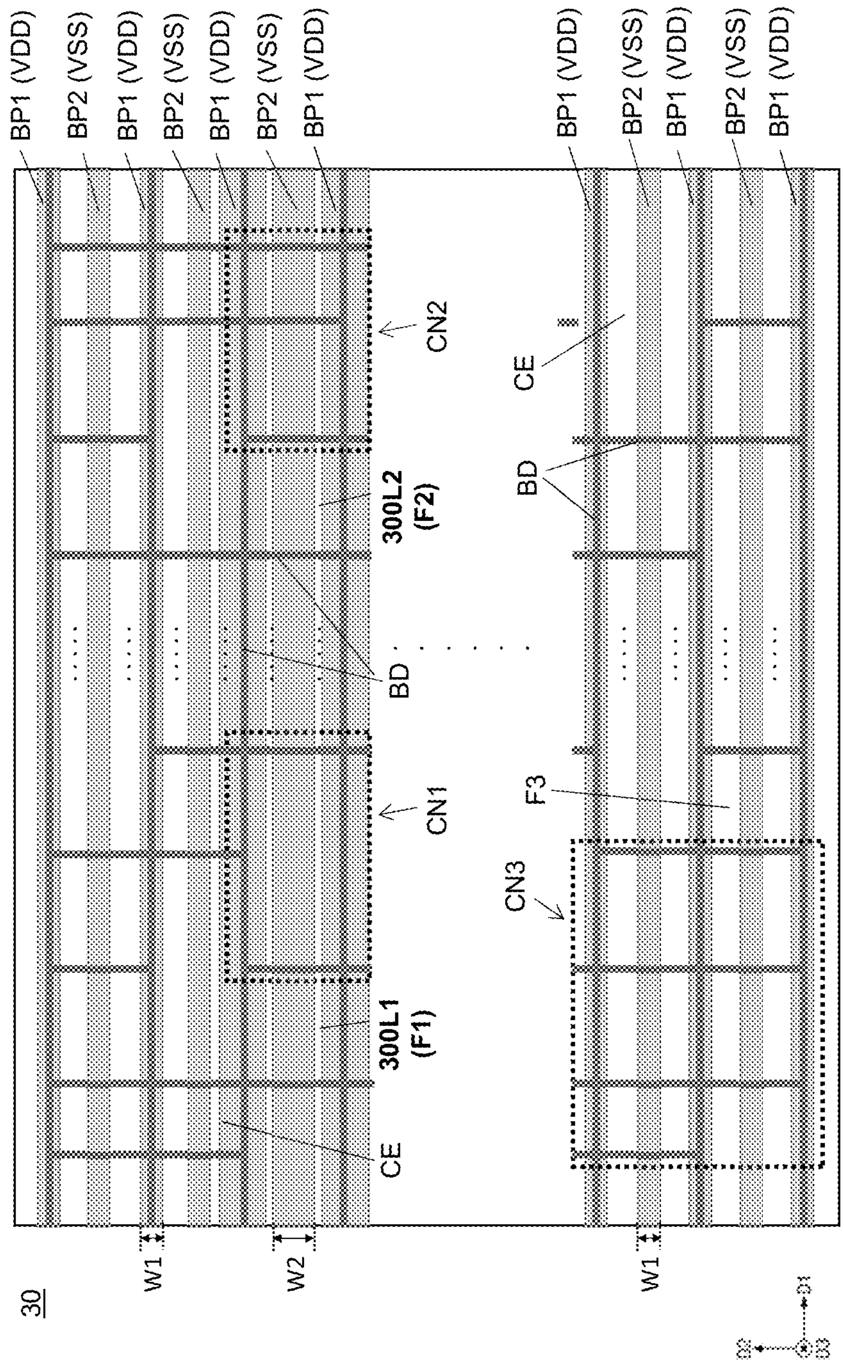
FIG. 3B illustrates a layout of a cell architecture including the logic cell of FIG. 3A, according to an embodiment.

FIG. 3A illustrates a layout of a logic cell changed from a fabric cell in a cell architecture including a BSPDN, according to another embodiment. FIG. 3B illustrates a layout of a cell architecture including the logic cell of FIG. 3A, according to an embodiment.

Referring to FIG. 3A, a logic cell 300L1 may include the same structural elements as those of the logic cell 200L shown in FIG. 2B. The logic cell 300L1 may also be formed from the fabric cell 200F. Thus, duplicate descriptions thereof may be omitted herein. However, the logic cell 300L1 may differ from the logic cell 200L in that the backside power rails BP1 and BP2 of the logic cell 300L1 are changed to have a width W2 that is greater than a width W1 of the backside power rails BP1 and BP2 of the logic cell 200L.

As described above, this width change of the backside power rails BP1 and BP2 may be enabled because the arrangement and formation of the backside power rails are not bound by the strict cell design rule applying to the frontside power rails.

Thus, while the backside power rails including the $2^{nd}$ backside power rail BP2 formed below the inside region of the logic cell provides various advantages described above to the cell architecture including the logic cell 300F, the wider backside power rails BP1 and BP2 may provide the cell architecture 30 including the logic cell 300F with an additional advantage in responding to an ECO including a power rail change. For example, the wider power rail may have a lower electrical resistance, which would result in a reduced IR drop along the power rail, ensuring that a more stable and higher supply voltage reaches the circuits elements connected to this power rail in the cell architecture. Further, as the wider power rail may be able to accommodate a higher current with a less DvD, a stable power delivery to the circuit elements connected thereto.

Referring to FIG. 3B, a cell architecture 30 may include the logic cell 300L1 which is formed by changing the fabric cell 200F shown in FIG. 2B. The fabric cell 200F may be one of the fabric cells F1-F3 respectively positioned to be adjacent to the candidate regions C1-C3 as shown in FIG. 2A. Herebelow, it is assumed that the fabric cell 200F is the fabric cell F1 at least for description convenience.

As the fabric cell F1 is changed to the logic cell 300L1 including not only the NAND gate but also the wider backside power rails BP1 and BP2, the $1^{st}$ backside power rails BP1 disposed below the upper boundary and the lower boundary and the $2^{nd}$ backside power rail BP2 disposed below the inside region of the logic cell 300L may be wider than the other backside power rails BP1 and BP2.

Further, the wider backside power rails BP1 and BP2 disposed below the logic cell 300L1 may be extended in the D1 direction to be disposed below a plurality of other cells CE in a same row in the cell architecture 30. For example, a logic cell 300L2 which may be formed by changing the fabric cell F2 shown in FIG. 2A, in response to a corresponding ECO, may also have the same wider backside power rails BP1 and BP2 disposed therebelow. These backside power rails BP1 and BP2 may be respectively disposed below upper and lower boundaries of the logic cell 300L2 which may extended from the upper and lower boundaries of the logic cell 300L1.

However, the disclosure may not be limited thereto, and, according to an embodiment, only portions of the backside power rails BP1 and BP2 in the cell architecture 30 disposed below the logic cell 300L1 may be changed to have the greater width W2 in response to a corresponding ECO, while the other portions of the backside power rails BP1 and BP2 remain to have the smaller width W1.

The cell architecture 30 may also be characterized in that, in response to the ECO to change the fabric cells F1 and F2, the fabric cell F3 may still remain as a dummy cell when there is no ECO to address a circuit redesign in the candidate region CN3. The fabric cell F2 may also remain as a dummy cell when there is no ECO to change the candidate region CN2, while the wider backside power rails BP1 and BP2 may still be disposed below the fabric cell F2.

FIGS. 3A and 3B show that all of the three backside power rails BP1 and BP2 disposed below the logic cell 300L1 are changed to have a greater width W2. However, the disclosure is not limited thereto. According to an embodiment, the three backside power rails BP1 and BP2 may be changed to have different widths, respectively, in response to a corresponding ECO. According to an embodiment, only one or two of the three backside power rails BP1 and BP2 may be changed to a wider backside power rail in response to a corresponding ECO. For example, only one of the $1^{st}$ backside power rails BP1 may be changed to have the greater width W2 while the other $1^{st}$ backside power rail remains to have the smaller width W1. As another example, only the $2^{nd}$ backside power rail BP2 disposed below the inside region of the logic cell 300L1 may be changed to have the greater width W2 while the $1^{st}$ backside power rails BP1 remain to have the smaller width W1.

Figure 4:
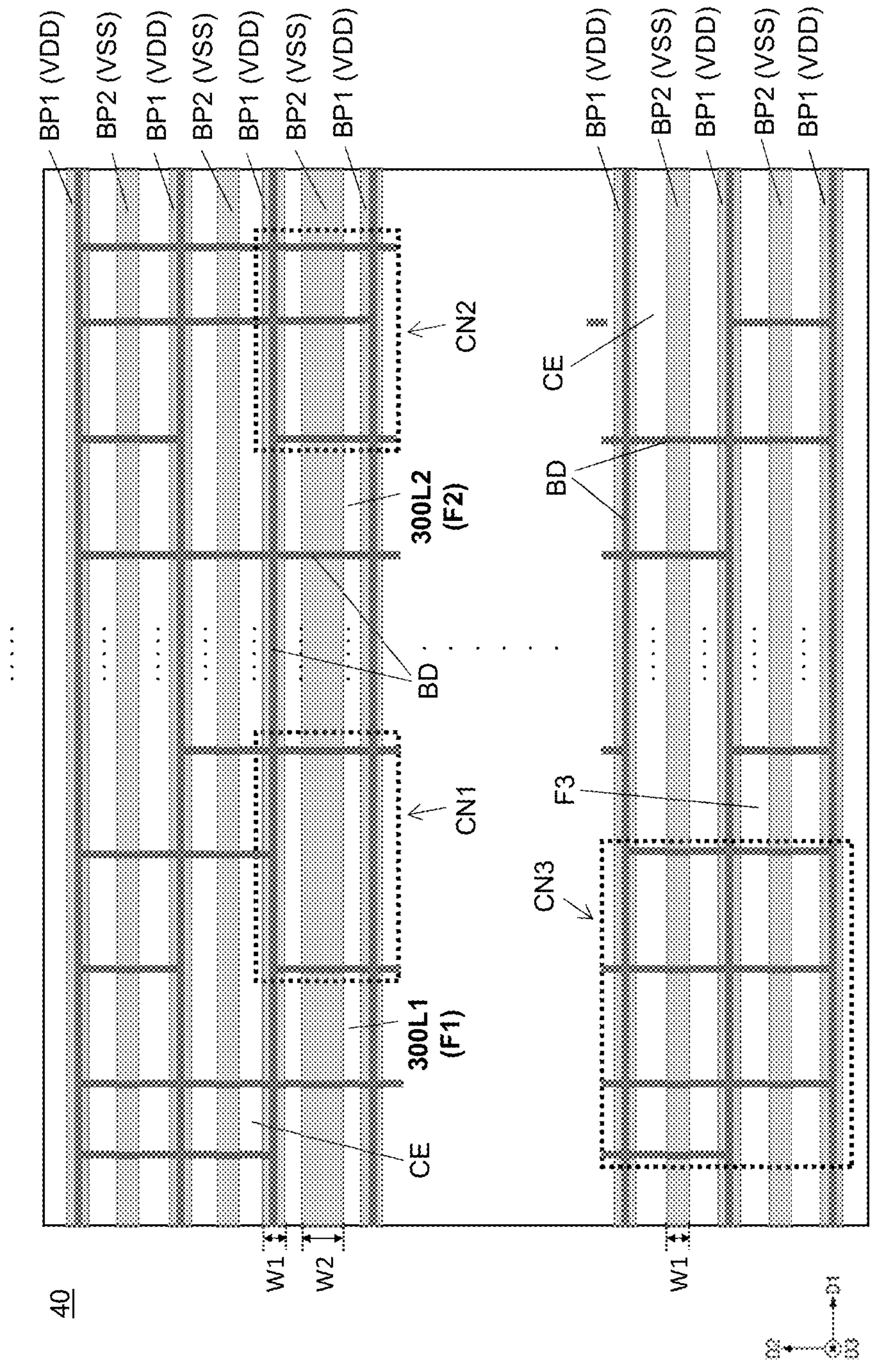
FIG. 4 illustrates a layout of a cell architecture including a BSPDN, according to yet another embodiment.

FIG. 4 illustrates a layout of a cell architecture including a BSPDN, according to yet another embodiment.

Referring to FIG. 4, a cell architecture 40 may have the same structural elements as those of the cell architecture 30 except that only the $2^{nd}$ backside power rail BP2 disposed below the inside region of the logic cell 400L1 is changed to have the greater width W2 while the other backside power rails remain to have the smaller width W1.

In the above-described embodiments, a plurality of cells CE arranged in a same row of the cell architectures 10, 20, 30 and 40 has a same cell height. However, the disclosure is not limited thereto, and thus, the backside power rails BP1 and BP2 may also be formed below a plurality of cells having different cell heights, and may also be changed to have a greater width in response to a corresponding ECO.

Figure 5:
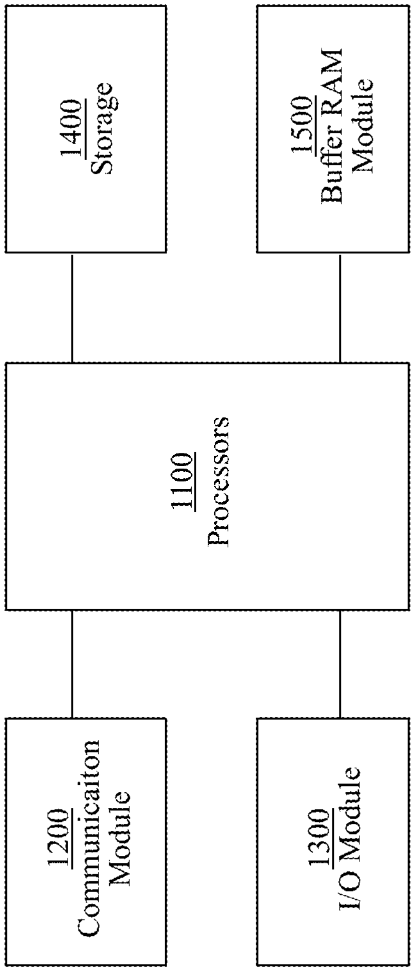
FIG. 5 is a schematic block diagram illustrating an electronic device including a plurality of semiconductor devices formed based on at least one of the cell architectures shown in FIGS. 1A, 2A, 3B and 4, according to embodiments.

FIG. 5 is a schematic block diagram illustrating an electronic device including a plurality of semiconductor devices formed based on at least one of the cell architectures shown in FIGS. 1A, 2A, 3B and 4, according to embodiments.

Referring to FIG. 5, an electronic device 1000 may include at least one processor 1100, a communication module 1200, an input/output module 1300, a storage 1400, and a buffer random access memory (RAM) module 1500. The electronic device 1000 may be a mobile device such as a smartphone or a tablet computer, not being limited thereto, according to embodiments.

The processor 1100 may include a central processing unit (CPU), a graphic processing unit (GPU) and/or any other processors that control operations of the electronic device 1000. The communication module 1200 may be implemented to perform wireless or wire communications with an external device. The input/output module 1300 may include at least one of a touch sensor, a touch panel a key board, a mouse, a proximate sensor, a microphone, etc. to receive an input, and at least one of a display, a speaker, etc. to generate an output signal processed by the processor 1100. The storage 1400 may be implemented to store user data input through the input/output module 1300, the output signal, etc. The storage 1400 may be an embedded multimedia card (eMMC), a solid state drive (SSD), a universal flash storage (UFS) device, etc.

The buffer RAM module 1500 may temporarily store data used for processing operations of the electronic device 1000. For example, the buffer RAM 1500 may include a volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 5, the electronic device 1000 may further include at least one sensor such as an image sensor.

At least one component in the electronic device 1000 may be formed based on at least one of the cell architectures of the above embodiments shown in FIGS. 1A, 2A, 3B and 4, according to embodiments.

The foregoing is illustrative of example embodiments and is not to be construed as limiting the disclosure. Although some example embodiments have been described above, those skilled in the art will readily appreciate that many modifications are possible in the above embodiments without materially departing from the disclosure.

What is claimed is:

1. A semiconductor device comprising:

a plurality of cells comprising a $1^{st}$ cell; and a $1^{st}$ backside power rail and a $2^{nd}$ backside power rail extended in a $1^{st}$ direction, spaced apart in a 2nd direction intersecting the 1st direction, and disposed below the $1^{st}$ cell in a $3^{rd}$ direction intersecting the $1^{st}$ and $2^{nd}$ directions, wherein the $1^{st}$ backside power rail has a $1^{st}$ width in the $2^{nd}$ direction, and the $2^{nd}$ backside power rail has a $2^{nd}$ width in the $2^{nd}$ direction which is different from the $1^{st}$ width, and wherein the $2^{nd}$ backside power rail is spaced apart from an upper cell boundary and a lower cell boundary of the $1^{st}$ cell in the $2^{nd}$ direction, and the $1^{st}$ cell comprises an active region that is between the upper cell boundary and the lower cell boundary in the $2^{nd}$ direction.

2. The semiconductor device of claim 1, wherein the $1^{st}$ backside power rail is disposed below the upper cell boundary or the lower cell boundary of the $1^{st}$ cell in the $3^{rd}$ direction, and further comprising:

a metal line disposed above the $1^{st}$ cell in the $3^{rd}$ direction.

3. The semiconductor device of claim 2, further comprising:

a $3^{rd}$ backside power rail; and a backside isolation structure disposed below the plurality of cells in the $3^{rd}$ direction, the backside isolation structure comprising an insulating material layer with the $1^{st}$, $2^{nd}$, and $3^{rd}$ backside power rails therein, wherein the $1^{st}$ and $3^{rd}$ backside power rails are disposed below the upper and lower cell boundaries of the $1^{st}$ cell, respectively, in the $3^{rd}$ direction, and wherein the $1^{st}$ cell is between the metal line and the backside isolation structure in the $3^{rd}$ direction.

4. The semiconductor device of claim 3, wherein the $1^{st}$ and $3^{rd}$ backside power rails are configured to provide the $1^{st}$ cell with a $1^{st}$ voltage, and the $2^{nd}$ backside power rail is configured to provide the $1^{st}$ cell with a $2^{nd}$ voltage different from the $1^{st}$ voltage.

5. The semiconductor device of claim 3, wherein the $3^{rd}$ backside power rail has a $3^{rd}$ width in the $2^{nd}$ direction which is the same as the $1^{st}$ width.

6. The semiconductor device of claim 1, wherein the plurality of cells comprises a $2^{nd}$ cell having a same cell height as the $1^{st}$ cell, wherein a $3^{rd}$ backside power rail is arranged in the $1^{st}$ direction and disposed below the $2^{nd}$ cell in the $3^{rd}$ direction, and wherein the $3^{rd}$ backside power rail has a $3^{rd}$ width which is the same as the $1^{st}$ width.

7. The semiconductor device of claim 1, wherein the 1st cell comprises a logic circuit configured to perform a logic function.

8. The semiconductor device of claim 7, further comprising a dummy cell which does not comprise any logic circuit configured to perform a logic function.

9. The semiconductor device of claim 8, wherein the $1^{st}$ cell and the dummy cell are disposed in different rows extended in the $1^{st}$ direction in a lay out of the semiconductor device.

10. The semiconductor device of claim 7, further comprising a $3^{rd}$ backside power rail having a $3^{rd}$ width which is the same as the $1^{st}$ width, wherein the $1^{st}$ and $3^{rd}$ power rails are disposed below the upper and lower cell boundaries of the $1^{st}$ cell in the $3^{rd}$ direction, respectively, and configured to provide the $1^{st}$ cell with a $1^{st}$ voltage, and wherein the $2^{nd}$ backside power rail is disposed below the $1^{st}$ cell, and configured to provide the $1^{st}$ cell with a $2^{nd}$ voltage different from the $1^{st}$ voltage.

11. A semiconductor device comprising:

a plurality of cells comprising $1^{st}$ cells arranged in a $1^{st}$ row of a layout of the semiconductor device; and a $1^{st}$ backside power rail and a $2^{nd}$ backside power rail extended in a $1^{st}$ direction, spaced apart in a $2^{nd}$ direction intersecting the $1^{st}$ direction, and disposed below the $1^{st}$ cells in a $3^{rd}$ direction intersecting the $1^{st}$ and $2^{nd}$ directions, wherein the $1^{st}$ cells respectively comprise an upper cell boundary, a lower cell boundary, and an active region that is between the upper cell boundary and the lower cell boundary in the $2^{nd}$ direction, wherein the $1^{st}$ backside power rail has a $1^{st}$ width in the $2^{nd}$ direction, and the $2^{nd}$ backside power rail has a $2^{nd}$ width in the $2^{nd}$ direction which is different from the $1^{st}$ width, and wherein the $2^{nd}$ backside power rail is spaced apart from the upper cell boundaries and the lower cell boundaries of the $1^{st}$ cells in the $2^{nd}$ direction.

12. The semiconductor device of claim 11, wherein the $1^{st}$ backside power rail is disposed below the upper cell boundaries or the lower cell boundaries of the $1^{st}$ cells in the $3^{rd}$ direction, and further comprising:

a metal line disposed above the $1^{st}$ cells in the $3^{rd}$ direction.

13. The semiconductor device of claim 12, further comprising:

a $3^{rd}$ backside power rail; and a backside isolation structure disposed below the plurality of cells in the $3^{rd}$ direction, the backside isolation structure comprising an insulating material layer with the $1^{st}$, $2^{nd}$, and $3^{rd}$ backside power rails therein, wherein the $1^{st}$ and $3^{rd}$ backside power rails are disposed below the upper cell boundaries and the lower cell boundaries of the $1^{st}$ cells, respectively, in the $3^{rd}$ direction, and wherein the $1^{st}$ cells are between the metal line and the backside isolation structure in the $3^{rd}$ direction.

14. The semiconductor device of claim 13, wherein the $1^{st}$ and $3^{rd}$ backside power rails are configured to provide the $1^{st}$ cell with a $1^{st}$ voltage, and the $2^{nd}$ backside power rail is configured to provide the $1^{st}$ cell with a $2^{nd}$ voltage different from the $1^{st}$ voltage.

15. The semiconductor device of claim 13, wherein the $3^{rd}$ backside power rail has a $3^{rd}$ width in the $2^{nd}$ direction which is the same as the $1^{st}$ width.

16. The semiconductor device of claim 11, wherein the plurality of cells comprises $2^{nd}$ cells arranged in a $2^{nd}$ row of the layout of the semiconductor device, wherein a $3^{rd}$ backside power rail is arranged in the $1^{st}$ direction and disposed below the $2^{nd}$ cells in the $3^{rd}$ direction, and wherein the $3^{rd}$ backside power rail has a $3^{rd}$ width in the $2^{nd}$ direction which is the same as the $1^{st}$ width.

17. The semiconductor device of claim 11, wherein the $1^{st}$ cells comprise:

a logic cell comprising a logic circuit configured to perform a logic function; and a dummy cell which does not comprise any logic circuit configured to perform a logic function.

18. A semiconductor device comprising:

a plurality of cells in a cell architecture comprising:

at least one $1^{st}$ cell comprising a logic circuit configured to perform a logic function, and at least one dummy cell which does not comprise any logic circuit configured to perform a logic function; and a plurality of backside power rails disposed below the plurality of cells, and extended in a $1^{st}$ direction in parallel with each other, spaced apart in a $2^{nd}$ direction intersecting the $1^{st}$ direction, and disposed below the plurality of cells in a $3^{rd}$ direction intersecting the $1^{st}$ and $2^{nd}$ directions, wherein one or more of the backside power rails are spaced apart from an upper cell boundary and a lower cell boundary of the at least one $1^{st}$ cell in the $2^{nd}$ direction, and the at least one $1^{st}$ cell comprises an active region that is between the upper cell boundary and the lower cell boundary in the $2^{nd}$ direction.

19. The semiconductor device of claim 18, wherein the at least one dummy cell comprises a plurality of gate structures.

20. The semiconductor device of claim 18, wherein the plurality of backside power rails have different widths, and further comprising:

a metal line disposed above the at least one $1^{st}$ cell in the $3^{rd}$ direction; and a backside isolation structure disposed below the plurality of cells in the $3^{rd}$ direction, the backside isolation structure comprising an insulating material layer with the $1^{st}$ and $2^{nd}$ backside power rails therein, wherein the at least one $1^{st}$ cell is between the metal line and the backside isolation structure in the $3^{rd}$ direction.

* * * * *